United States Patent [19]
Shiga et al.

[11] Patent Number: 6,072,126
[45] Date of Patent: *Jun. 6, 2000

[54] PRINTED WIRING BOARD WITH GROUNDING LINES ARRANGED BETWEEN WIRING LINES

[75] Inventors: Sadakazu Shiga; Naoyuki Hatano, both of Fukushima-ken, Japan

[73] Assignee: Alps Electronics Co., Ltd., Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/924,463

[22] Filed: May 1, 1997

[30] Foreign Application Priority Data

May 15, 1996 [JP] Japan ..................... 8-145095

[51] Int. Cl.[7] ..................................... H05K 1/02

[52] U.S. Cl. ..................... 174/250; 174/72 TR

[58] Field of Search .......... 333/1, 12; 400/472; 174/72 TR, 250

[56] References Cited

U.S. PATENT DOCUMENTS

| | | | |
|---|---|---|---|
| 3,398,232 | 8/1968 | Hoffman | 174/254 |
| 4,127,740 | 11/1978 | LaMarche | 174/254 |
| 4,615,604 | 10/1986 | Yamada | 354/542 |
| 4,780,157 | 10/1988 | Coon | 156/53 |
| 4,857,684 | 8/1989 | Gratke | 200/600 |
| 5,155,570 | 10/1992 | Tomizuka et al. | 357/40 |
| 5,281,765 | 1/1994 | Iura et al. | 174/117 F |
| 5,523,755 | 6/1996 | Wooten | 341/22 |
| 5,844,783 | 12/1998 | Kojima | 361/777 |

*Primary Examiner*—John Hilten
*Assistant Examiner*—Daniel J. Colilla
*Attorney, Agent, or Firm*—Brinks, Hofer Gilson & Lione

[57] ABSTRACT

A circuit board comprises: a plurality of solder lands, a wiring pattern having a plurality of wiring lines connected to the solder lands, respectively, an output terminal formed at one end of each of the wiring lines of the wiring pattern, an integrated control circuit connected to the solder lands, and a grounding pattern to be held at a ground potential. The grounding pattern has grounding lines formed between adjacent wiring lines of the wiring pattern, respectively, so as to be coupled to the wiring lines by capacitive coupling.

3 Claims, 6 Drawing Sheets

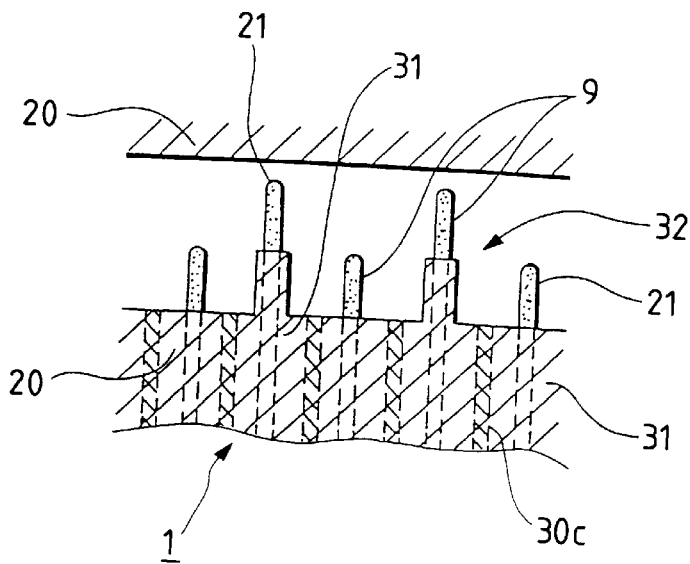
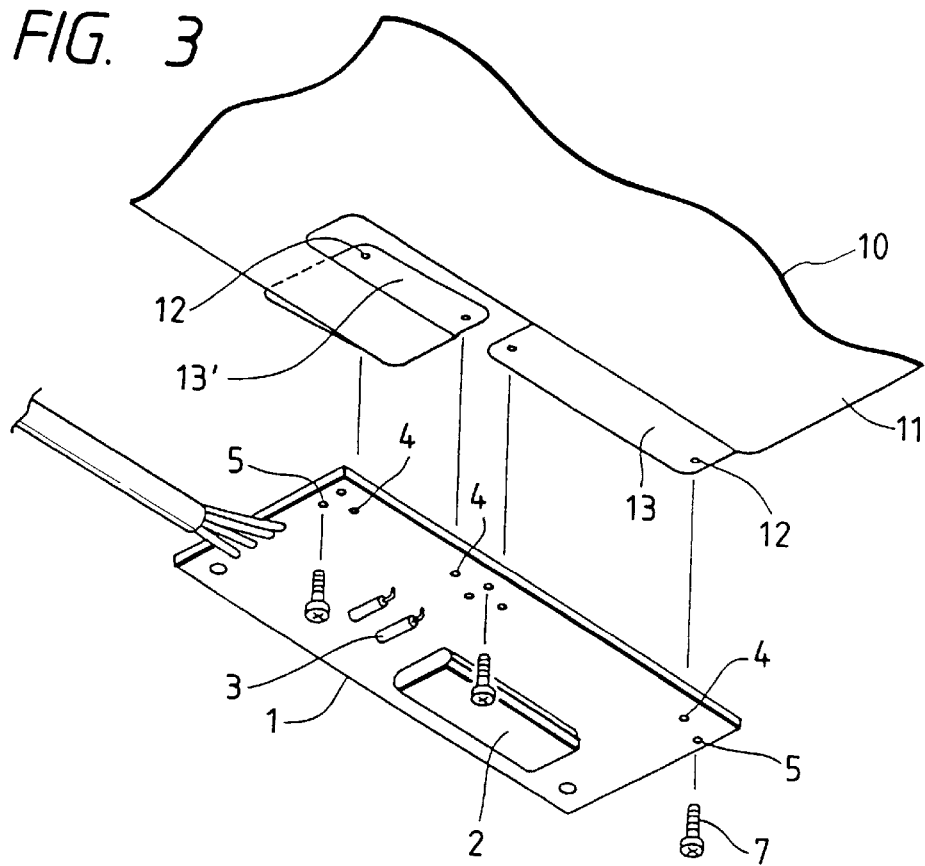

PRINTED WIRING BOARD WITH GROUNDING LINES ARRANGED BETWEEN WIRING LINES

BACKGROUND OF THE INVENTION

The present invention relates to a printed wiring board and a keyboard provided with the same printed wiring board. More specifically, the present invention relates to a printed wiring board capable of reducing radiation noise, and a keyboard provided with the same printed wiring board.

A circuit board included in a keyboard is formed by fabricating an integrated circuit for scanning and controlling a plurality of key switches, electronic parts including resistors and capacitors, and wiring patterns for electrically interconnecting the electronic parts on a board of a phenolic resin or the like. Signals produced by the electronic parts are transmitted by the wiring patterns.

Since the electronic parts are mounted in a high packaging density on the circuit board, lines forming the wiring patterns are arranged close to each other. Therefore, signals transmitted through the wiring patterns are affected by high-frequency noise. High-frequency noise in an electric signal is radiated as radiant noise outside the circuit board and the keyboard while the electric signal is transmitted through the wiring patterns. Such radiant noise affect external electronic equipment adversely.

Some conventional keyboard is provided with key switches formed on a flexible sheet. This keyboard is provided with membrane switches each consisting of a fixed electrode printed on a first insulating film and a movable electrode printed on a second insulating film, and a circuit board of a phenolic resin or the like carrying an integrated control circuit for sequentially scanning the fixed electrodes and the movable electrodes.

When the integrated control circuit provides a scanning signal on the key switches, patterns of the key switches serve as an antenna and high-frequency noise contained in the scanning signal is radiated by the key switches of the keyboard to affect external electronic equipment adversely.

Referring to FIG. 4 showing an essential portion of a conventional membrane switch sheet 10 in an exploded perspective view, the membrane switch sheet 10 has a flexible sheet 11 of a three-layer construction consisting of a first insulating film 11a of a thickness in the range of about 100 to about 200 μm, an insulating spacer film 11e of a thickness in the range of about 100 to about 200 μm, and a second insulating film 11g of a thickness in the range of about 100 to about 200 μm. The first insulating film 11a is a film of an insulating material, such as a polyester film. Formed by printing on the upper surface of the first insulating film 11a is a 5 to 25 μm thick conductive pattern of a conductive material, such as a mixture of silver and carbon, having a plurality of stationary electrodes 11b and first wiring lines 11d. The spacer film 11e is sandwiched between the first insulating film 11a and the second insulating film 11g. The second insulating film 11g is a film of an insulating material, such as a polyester film. Formed by printing on the lower surface of the second insulating film 11g is a 5 to 25 μm thick conductive pattern of a conductive material, such as a mixture of silver and carbon, having a plurality of movable electrodes 11h and second wiring lines 11j. The spacer film 11e is provided with through holes 11f of a size that allows the movable electrodes 11h to come into contact with the corresponding stationary electrodes 11b, formed at positions respectively corresponding to the stationary electrodes 11b. Characters and numerals, not shown, are printed or key tops (driving members), not shown, of key switches are arranged on the upper surface of the second insulating film 11g at positions corresponding to the movable electrodes 11h.

The insulating films 11a and 11g and the spacer film 11e are provided in their corners with positioning holes 12. The positioning holes 12 are used for correctly positioning the membrane switch sheet 10 relative to a circuit board 1 when fastening the membrane switch sheet 10 to the circuit board 1. The circuit board 1 and the membrane switch sheet 10 are held on a frame, now shown, to form a keyboard.

As shown in FIG. 7, terminals 13a are formed in end portions of the first wiring lines 11d gathered in an output terminal lug 13 projecting from a portion of the first insulating film 11a. Terminals 13a' are formed in end portions of the second wiring lines 11j gathered in an output terminal lug 13' projecting from a portion of the second insulating film 11g. The terminals 13a and 13a' are staggered in two rows.

The first insulating film 11a, the spacer film 11e and the second insulating film 11g are stacked in that order to form the three-layer flexible sheet 11. In this flexible sheet 11, the electrodes 11b and 11h are disposed opposite to each other on the opposite sides of the through holes 11f. When keys, not shown, are depressed, the movable contacts 11h printed on the second insulating film 11g are pressed against the corresponding stationary electrodes 11b. When pressure is removed from the keys, the movable electrodes 11h are returned to their original positions by the resilience of the second insulating sheet 11g. Generally, the membrane switch sheet 10 is referred to as a key switch sheet.

Referring to FIGS. 5 and 6 showing a circuit board 1 employed in a conventional keyboard, the circuit board 1 is provided with a wiring pattern 6 on a surface thereof. A first solder land 8 to be connected to an integrated control circuit 2 (FIG. 3) is formed at one end of each of the wiring lines of the wiring pattern 6, and a second solder land 9 to be connected to the terminal 13a of the terminal lug 13 is formed at the other end of the same wiring line. The surface of the circuit board 1 excluding regions thereof in which the solder lands 8 and 9 are formed is coated with a resist film, not shown. The second solder lands 9 are staggered in two rows so as to correspond to the terminals 13a and 13a' formed in the end portions of the wiring lines 11d and 11j gathered in the output terminal lugs 13 and 13', respectively. As shown in FIG. 8, solder pads 21 of a height W are formed on the second solder lands 9, respectively. The solder pads 21 are formed by a dipping process which dips the circuit board 1 in molten solder. The second solder lands 9 of the circuit board 1 are simply pressed against the output terminal lugs 13 and 13' of the membrane switch sheet 10 for connection to the terminals 13a and 13a' of the output terminal lugs 13 and 13', and is held in contact with the terminals 13a and 13a' by the frame, not shown, holding the membrane switch sheet 10. The integrated control circuit 2 supplies a scanning signal through the second solder lands 9 to the membrane switch sheet 10.

A grounding pattern 30 having a plurality of base portions 30a and connecting portions 30d is formed in addition to the wiring pattern 6 on the surface of the circuit board 1. Each of the base portions 30a is formed in a relatively large area, and the plurality of base portions 30a are connected by the connecting portions 30d. The grounding pattern 30 is connected to a ground of a ground potential.

As shown in FIG. 3, the circuit board 1 is provided with a plurality of positioning holes 4 and through holes 5, and electronic parts including the integrated control circuit 2 for scanning and controlling the membrane switch sheet 10 and capacitors 3 are connected by soldering to the wiring pattern 6. The positioning holes 4 of the circuit board 1 corresponds to the positioning holes 12 of the membrane switch sheet 10, respectively, to position the circuit board 1 relative to the membrane switch sheet 10 when assembling the circuit board 1 and the membrane switch sheet 10. Screws 7 are screwed through the through holes 5 in the frame to fasten the circuit board 1 together with the membrane switch sheet 10 to the frame.

The membrane switch sheet 10 is disposed on the circuit board 1. End portions of the wiring lines 11d and 11j of the wiring patterns of the flexible sheet 11 are gathered in the protruding output terminal lugs 13 and 13'. The terminals 13a and 13a' formed at the ends of the wiring lines 11d and 11j in the output terminal lugs 13 and 13' are connected to the second solder lands 9 of the wiring pattern 6.

The output terminal lug 13' of the first insulating film 11a is folded back. Consequently, the respective surfaces of the output terminal lugs 13 and 13' carrying the patterns are included in a plane and hence both the patterns formed on the output terminal lugs 13 and 13' are disposed opposite to the second solder lands 9 formed on the circuit board 1. Therefore, the terminals 13a and 13a' staggered on the surfaces of the output terminal lugs 13 and 13' can be connected to the second solder lands 9, respectively, simply by pressing the second solder lands 9 against the flexible sheet 11.

A control signal, i.e., a scanning signal, provided by the integrated control circuit 2 is transmitted through the wiring patterns. Then, the wiring patterns radiate radiant noise of a level not meeting requirements specified in standards prescribed by the FCC (Federal Communications Commission) outside the keyboard to affect external electronic equipment adversely.

FIG. 9 is a graph showing the noise characteristics of a conventional keyboard. As shown in FIG. 9, the radiant noise has a relatively high noise level of 42 dB$\mu$V/m at frequencies around 80 MHz. This noise level exceeds a limit noise level specified in the standards of the FCC. Therefore, a capacitor, not shown, for removing noise is inserted in a connecting portion of the membrane switch sheet 10 through which the scanning signal is transferred from the integrated control circuit 2 to the membrane switch sheet 10 to meet the requirements of the FCC. The noise characteristics shown in FIG. 9 was measured by Class B, Method 3m specified in the standards of the FCC.

SUMMARY OF THE INVENTION

Accordingly, it is an object of the present invention to provide a circuit board and a keyboard provided with the same circuit board capable of suppressing the leakage of radiant noise generated in wiring patterns formed in the circuit board outside from the keyboard.

According to a first aspect of the present invention, a circuit board comprises: a plurality of solder lands, a wiring pattern having wiring lines connected to the solder lands, respectively, an output terminal formed at one end of each of the wiring lines of the wiring pattern, an integrated control circuit connected to the solder lands, and a grounding pattern to be held at a ground potential, having grounding lines formed between the adjacent wiring lines of the wiring pattern, respectively.

In this circuit board, the grounding lines of the grounding pattern may be formed between the adjacent wiring lines of the wiring pattern continuously extending between the solder lands and the output terminals throughout the entire length of the wiring lines including the solder lands and the output terminals.

According to a second aspect of the present invention, a circuit board comprises: solder lands to be connected to an integrated control circuit, a wiring pattern having wiring lines connected to the solder lands, and a grounding pattern to be held at a ground potential, having grounding lines disposed between the adjacent solder lands, respectively.

According to a third aspect of the present invention, a keyboard comprises: a flexible sheet having a first insulating film provided with terminals, and a second insulating film provided with terminals; and a circuit board having solder lands, a wiring pattern having a plurality of wiring lines respectively extending from the solder lands, output terminals formed at the free ends of the wiring lines of the wiring pattern, an integrated control circuit connected to the solder lands, and grounding pattern to be held at a ground potential, having grounding lines. The respective terminals of the first and the second insulating films of the flexible sheet are connected to the terminals of the circuit board, and the grounding lines of the grounding pattern are formed between the adjacent wiring lines of the wiring pattern.

BRIEF DESCRIPTION OF THE DRAWINGS

The above and other objects, features and advantages of the present invention will become more apparent from the following description taken in connection with the accompanying drawings, in which:

FIG. 2 is an enlarged fragmentary plan view of an output terminal section of the circuit board of FIG. 1;

FIG. 3 is an exploded perspective view of assistance in explaining the circuit board of FIG. 1 and a membrane switch sheet;

DESCRIPTION OF THE PREFERRED EMBODIMENTS

Figure 1:
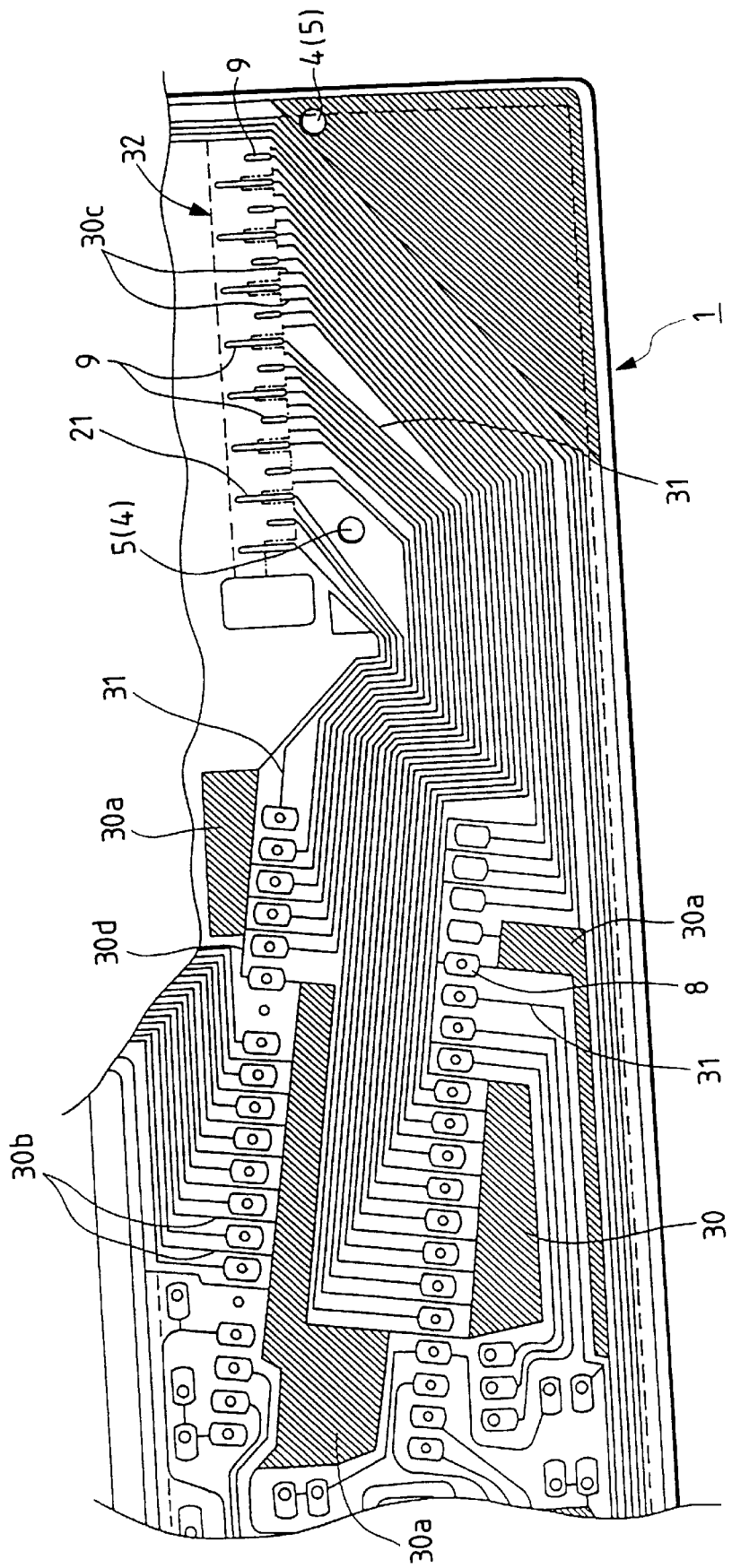
FIG. 1 is a fragmentary plan view of circuit board in a preferred embodiment according to the present invention for a keyboard.
Figure 4:
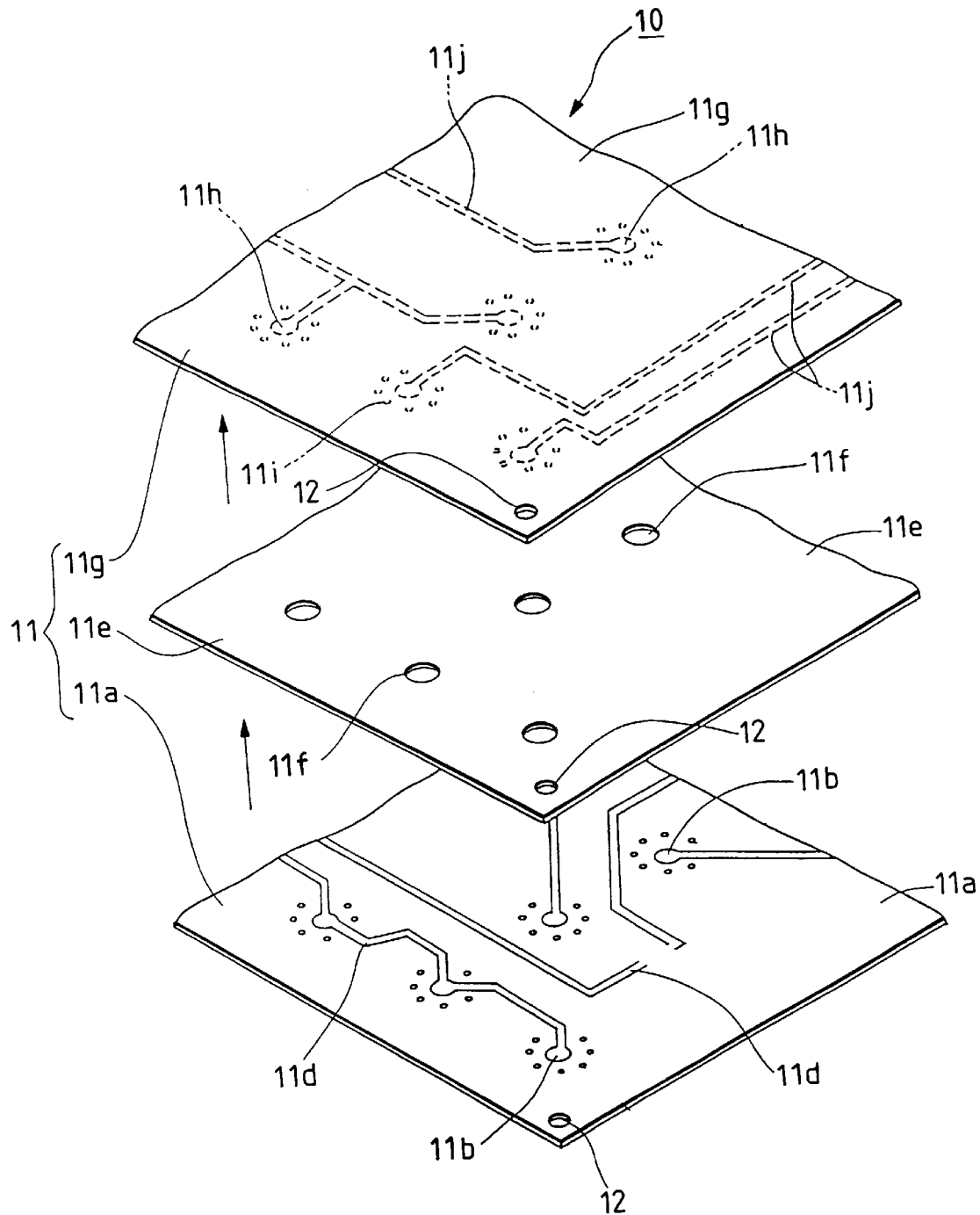
FIG. 4 is a fragmentary, exploded perspective view of a conventional membrane switch sheet.
Figure 5:
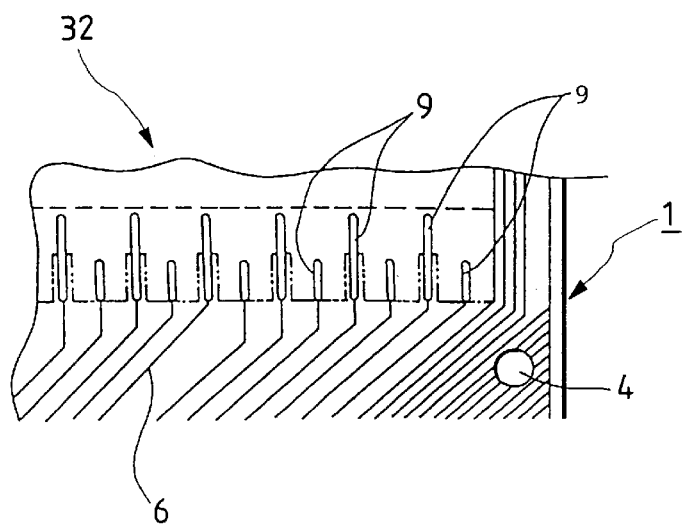
FIG. 5 is an enlarged, fragmentary plan view of an output terminal section of a conventional circuit board.
Figure 6:
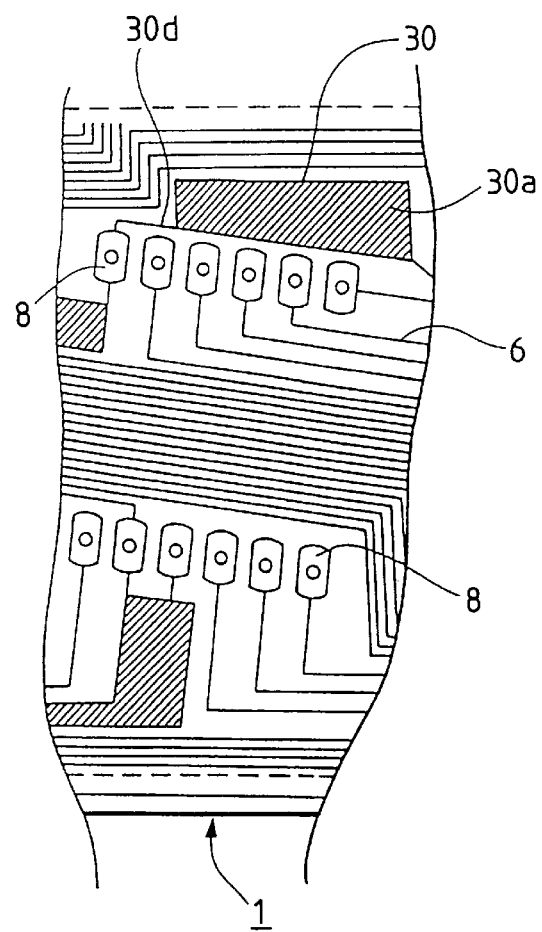
FIG. 6 is an enlarged, fragmentary plan view of a portion provided with solder lands of an integrated control circuit formed on the conventional circuit board of FIG. 5.

A circuit board in a preferred embodiment according to the present invention and a keyboard employing the same circuit board will be described with reference to FIGS. 1 to 3, in which parts like or corresponding to those previously mentioned in connection with the description of the conventional circuit board and the conventional keyboard are designated by the same reference characters and the detailed description thereof will be omitted.

Figure 7:
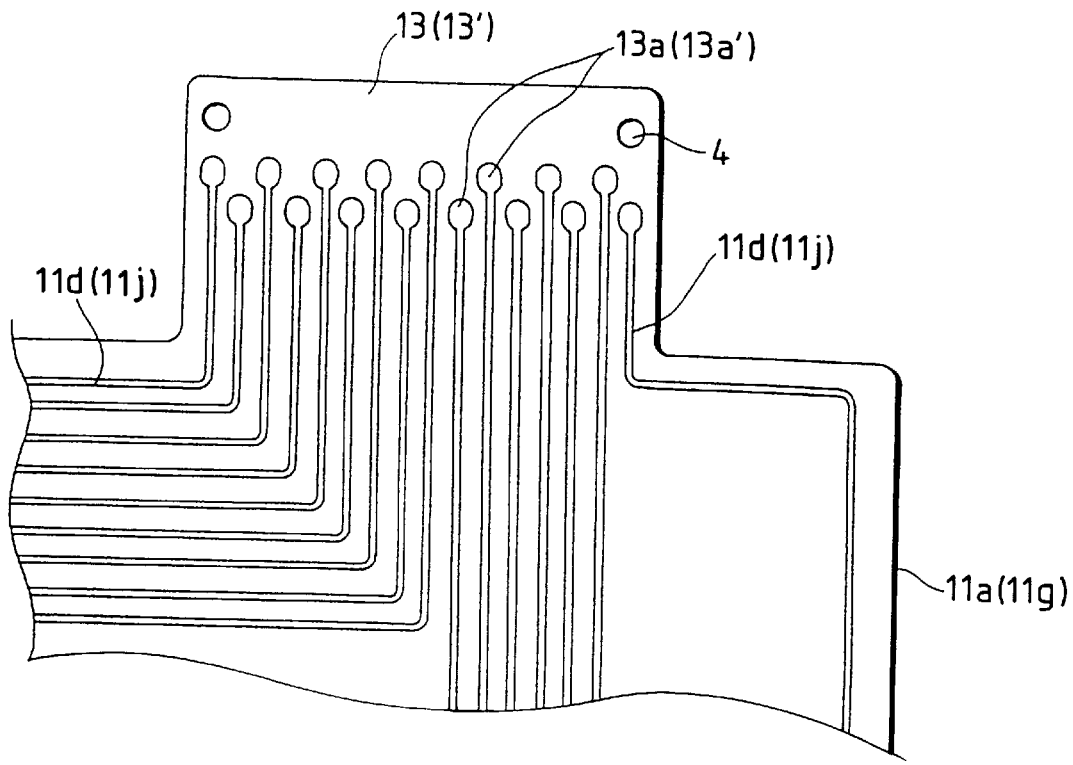
FIG. 7 is an enlarged, fragmentary plan view of a portion provided with terminals of a conventional membrane switch sheet.
Figure 8:
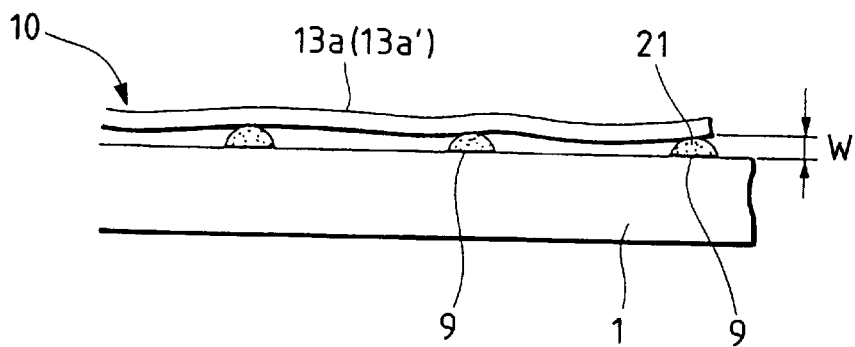
FIG. 8 is an enlarged, fragmentary side view of solder pads formed on solder lands.

Referring to FIG. 1, a wiring pattern having wiring lines 31 is formed on a surface of a circuit board 1. A first solder land 8 and a second solder land 9 are formed at one end and the other end, respectively, of each wiring line 31. The surface of the circuit board I excluding regions in which the first solder lands 8 and the second solder lands 9 are formed is coated with a resist film 20 (FIG. 2). The second solder lands 9 are staggered in two rows. The arrangement of the second solder pads 9 is the same as those of the terminals 13a and 13a' (FIG. 7) formed at the ends of the first wiring lines lid and the second wiring lines 11j gathered in the output terminal lugs 13 and 13' of the conventional flexible sheet 11. Solder pads 21 are formed on the second solder lands 9, respectively, by a dipping process which dips the circuit board 1 in molten solder. An integrated control circuit 2, which scans key switches, is electrically connected to the first solder lands 8. The solder pads 21 formed on the second solder lands 9 are electrically connected to the terminals 13a and 13a', formed at the ends of the first wiring lines lid and the second wiring lines 11j.

As shown in FIG. 1, also formed on the surface of the circuit board 1 is a grounding pattern 30 having a plurality of base portions 30a each having a relatively large area, a plurality of interjacent portions 30b, a plurality of end portions 30c and a plurality of connecting portions 30d. The interjacent portions 30b are formed between the adjacent first solder lands 8 to which the integrated control circuit 2 is electrically connected. The end portions 30c are arranged near the second solder lands 9 connected to the ends of the wiring lines 31 and staggered in two rows. The connecting portions 30d electrically connect the plurality of base portions 30a.

The base portions 30a, the interjacent portions 30b and the end portions 30c are electrically connected by the connecting portions 30d, and the grounding pattern 30 is held at a ground potential. The interjacent portions 30b of the grounding pattern 30 are extended substantially in parallel to the wiring lines 31, i.e., signal lines, through which a control signal for scanning the key switches of a membrane switch sheet 10 similar to the foregoing membrane switch sheet 10 employed in the conventional keyboard is transmitted. The end portions 30c of the grounding pattern 30 are substantially parallel to the end portions of the wiring lines 31 connected to the second solder lands 9.

Thus, the interjacent portions 30b and the end portions 30c of the grounding pattern 30 are substantially parallel to the entire length of the wiring lines 31 between the first solder lands 8 and the second solder lands 9 formed in an output terminal portion 32, respectively. Naturally, whereas the wiring lines 31 are electrically connected to the second solder lands 9, respectively, the portions 30a, 30b, 30c and 30d of the grounding pattern 30 are not electrically connected to the solder lands 9. Those portions 30b and 30c of the grounding pattern 30 and the wiring lines 31 parallel to those portions 30b and 30c of the grounding pattern 30 are coupled by capacitive coupling, and high-frequency noise traveling together with an electric signal through the wiring lines leaks into the grounding pattern 30. Consequently, the leakage of radiant noise from the circuit board 1 and a keyboard employing the circuit board 1 is reduced and hence the adverse effect of the radiant noise on external electronic equipment can be reduced.

Although it is desirable to dispose the interjacent portions 30b and the end portions 30c of the grounding pattern 30 as close to the wiring lines 31 as possible, any portions of the grounding pattern 30 cannot be arranged near some portions of the wiring lines 31 because of the high-density arrangement of electric parts on the circuit board 1. However, it is possible to make radiant noise leak from the wiring lines 31 into the grounding pattern 30 and radiation of radiant noise from the keyboard can be reduced only if the portions of the grounding pattern 30 are parallel to the wiring lines 31 in most regions on the circuit board 1.

The membrane switch sheet 10, has a flexible sheet 11 of a three-layer construction. The circuit board 1 and the membrane switch sheet 10 are assembled by a method similar to that of assembling the conventional circuit board 1 and the membrane switch sheet 10. The assembly of the circuit board 1 and the membrane switch sheet 10 is incorporated into a frame structure to construct a keyboard in accordance with the present invention.

Figure 9:
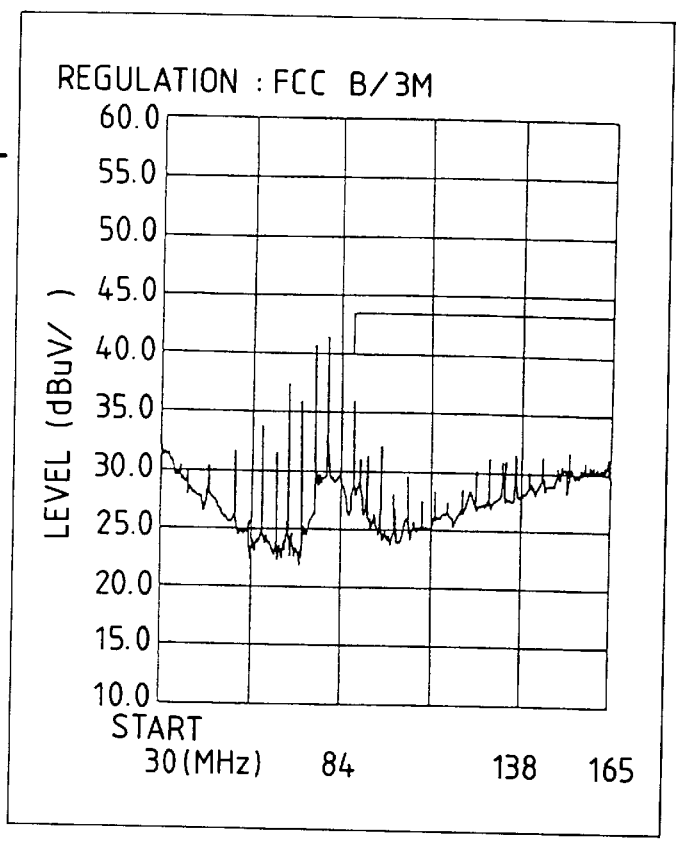
FIG. 9 is a graph showing the noise characteristics of a conventional keyboard.
Figure 10:
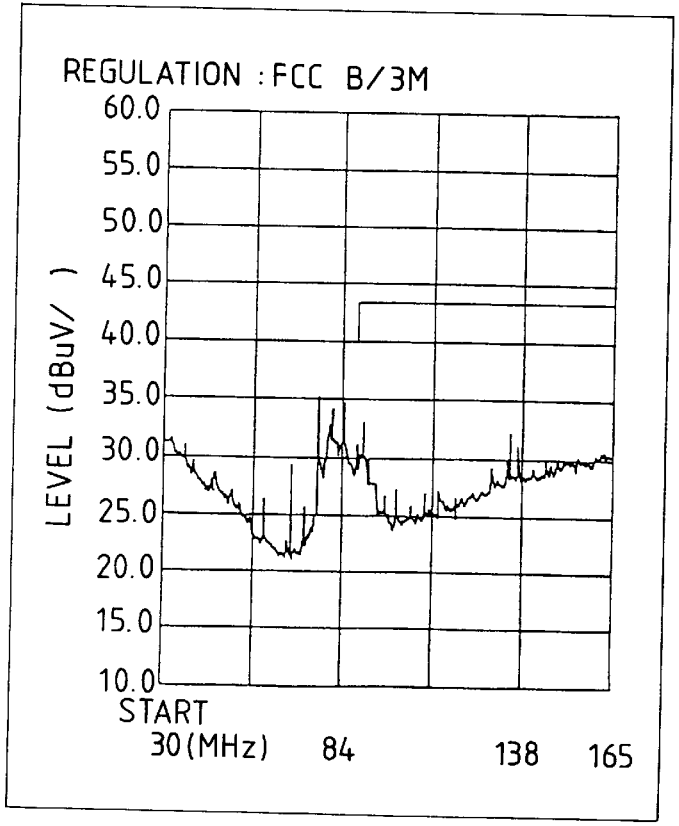
FIG. 10 is a graph showing the noise characteristics of a keyboard in accordance with the present invention.

The noise characteristics of the keyboard of the present invention and the conventional keyboard will comparatively be described with reference to FIGS. 9 and 10. The radiant noise at frequencies around 80 MHz generated by the keyboard of the present invention is 35 dB$\mu$V/m, which is lower by about 7 dB$\mu$V/m than the noise level of 42 dB$\mu$V/m at frequencies around 80 MHz of the radiant noise generated by the conventional keyboard. Therefore, the adverse effect of the keyboard of the present invention on external electronic equipment is lower than that of the conventional keyboard. The noise level of 35 dB$\mu$V/m of the radiant noise of frequencies around 80 MHz generated by the keyboard of the present invention is lower by about 5 dB$\mu$V/m than the upper limit noise level of 40 dB$\mu$V/m for frequencies around 80 MHz specified in the standards of the FCC. Generally, the noise level of radiant noise of frequencies in the frequency band of 30 to 165 MHz is lower than that of radiant noise generated by the conventional keyboard by about 2 to about 5 dB$\mu$V/m.

As is apparent from the foregoing description, according to the present invention, the grounding pattern held at the ground potential has the interjacent portions formed between the adjacent wiring lines for transmitting an electric signal, and the interjacent portions of the grounding pattern are coupled to the wiring lines by capacitive coupling to make high-frequency noise leak from the wiring lines into the grounding pattern. Therefore, high-frequency noise and hence radiant noise can be reduced.

Since the adjacent portions of the grounding pattern are extended substantially in parallel to the wiring lines substantially throughout the length of the wiring lines including the solder lands, the interjacent portions of the grounding pattern are coupled satisfactorily to the wiring lines by capacitive coupling to make high-frequency noise leak from the wiring lines into the grounding pattern. Therefore, high-frequency noise and hence radiant noise can effectively be reduced.

Although the invention has been described in its preferred form with a certain degree of particularity, obviously many changes and variations are possible therein. It is therefore to be understood that the present invention may be practiced otherwise than as specifically described herein without departing from the scope and spirit thereof.

What is claimed is:

1. A circuit board comprising:
   a plurality of solder lands;
   a wiring pattern having a plurality of wiring lines connected to the solder lands, respectively, each wiring line having two sides;
   an output terminal formed at one end of each of the wiring lines of the wiring pattern;
   an integrated control circuit connected to the solder lands; and a grounding pattern to be held at a ground potential, the grounding pattern comprising a plurality of grounding lines, each grounding line having a base portion adjacent a solder land, the grounding lines formed between the wiring lines of the wiring pattern wherein each grounding line is disposed between adjacent wiring lines, and the wiring lines and the erounding lines are arranged to provide a capacitance coupling between these lines over the length between the grounding pattern and the output terminal.

2. A circuit board according to claim 1, wherein the grounding lines of the grounding pattern are extended between the wiring lines of the wiring pattern continuously extending between the solder lands and the output terminals substantially throughout the entire length of the wiring lines including the solder lands and the output terminals.

3. A circuit board for use in a keyboard comprising:

a flexible sheet having a first insulating film provided with terminals, and a second insulating film provided with terminals; and the circuit board having solder lands, a wiring pattern having a plurality of wiring lines respectively extending from the solder lands, each wiring line having two sides and a free end, output terminals formed at the free ends of the wiring lines of the wiring pattern, respectively, an integrated control circuit connected to the solder lands, and a grounding pattern to be held at a ground potential, the grounding pattern comprising a plurality of grounding lines, each grounding line having a base portion adjacent a solder land;

wherein the respective terminals of the first and the second insulating films of the flexible sheet are connected to the output terminals of the circuit board, each grounding line of the grounding pattern is disposed between adjacent wiring lines of the wiring pattern to sandwich each grounding line between adjacent wiring lines.

* * * * *

UNITED STATES PATENT AND TRADEMARK OFFICE
CERTIFICATE OF CORRECTION

PATENT NO.    : 6,072,126
DATED         : June 6, 2000
INVENTOR(S)   : Sadakazu Shiga et al.

It is certified that error appears in the above-identified patent and that said Letters Patent is hereby corrected as shown below:

Claim 1,
Line 16, change "erounding" to -- grounding --.

Signed and Sealed this

Twenty-third Day of October, 2001

Attest:

*Attesting Officer*

NICHOLAS P. GODICI
*Acting Director of the United States Patent and Trademark Office*